United States Patent [19]

Jones et al.

[11] Patent Number: 4,480,150

[45] Date of Patent: Oct. 30, 1984

[54] LEAD FRAME AND METHOD

[75] Inventors: Raymond N. Jones; John M. Lawson, both of Scottsdale; O'Dell F. Keil, Phoenix, all of Ariz.

[73] Assignee: Motorola, Inc., Schaumburg, Ill.

[21] Appl. No.: 397,662

[22] Filed: Jul. 12, 1982

[51] Int. Cl.$^3$ ................... H01L 23/48; H05K 5/02
[52] U.S. Cl. ................... 174/52 FP; 29/423; 29/574; 29/827; 206/330; 357/70; 361/421
[58] Field of Search .............. 174/52 FP; 357/70; 361/421; 29/423, 430, 574, 827; 428/571; 206/330

[56] References Cited

U.S. PATENT DOCUMENTS 3,426,423  2/1969  Koch et al. ................ 174/52 FP X

OTHER PUBLICATIONS

*Electronics*, vol. 40, No. 15, Jul. 24, 1967, pp. 36, 37, McGraw-Hill, Albany, New York.

Primary Examiner—John F. Gonzales
Assistant Examiner—D. A. Tone
Attorney, Agent, or Firm—William J. Kubida

[57] ABSTRACT

A lead frame and method in which an adhesive tape strip such as Mylar is rolled or pressed along the undersurface of the lead frame to contact the lead frame and bonding pad undersurfaces. Upon removal of the tags retaining the individual circuit elements to the lead frame, the parts are maintained in their existing orientation and position by the tape strip in conjunction with the lead frame. The circuit elements may then be handled as a unit by means of the lead frame/tape strip combination in subsequent testing, marking, lead bending or other handling operations.

13 Claims, 2 Drawing Figures

LEAD FRAME AND METHOD

BACKGROUND OF THE INVENTION

The present invention relates to the field of lead frames and methods. More particularly, the present invention relates to lead frames and methods of especial utility in the handling of a plurality of electronic parts of small physical dimensions.

In the manufacture of miniature electronic devices, it is common practice to individually bond a plurality of circuit die elements or other devices to respective bonding pads attached to strip like lead frames. Lead frames of this type facilitate the pick and place positioning and bonding of the individual circuit elements to the bonding pad during this operation. Ultimately, these individual circuit elements with the bonding pad must be separated from the lead frame by removal of the tag securing them to the frame. Generally this must be done prior to testing, lead bending, marking or other subsequent operations.

However, these parts are inherently difficult to handle individually due to their small size, and overall, the physical dimensions of such circuit elements are continually decreasing as technology progresses. Moreover, upon removal from the lead frame, the proper orientation of each element becomes lost and they must be reoriented with the expenditure of even greater operator time and effort.

To solve the problem of individually retaining the circuit elements upon removal of the tag securing them to the lead frame, there has previously been proposed the conjunctive use of a paper or plastic tape having individual pockets to retain the removed elements. This tape, advanced 90 degrees to the longitudinal axis of the lead frame, allows the individual elements to drop in a random orientation into a retaining pocket upon its removal from the lead frame. However, this method is expensive to implement in terms of both tape and related equipment, does not retain a uniform orientation of the part and adds an additional handling step prior to performing tests, marking or lead bending operations.

It is therefore an object of the present invention to provide an improved lead frame and method.

It is further an object of the present invention to provide an improved lead frame and method which is inexpensive to implement using readily available materials.

It is still further an object of the present invention to provide an improved lead frame and method in which the orientation and position of the individual elements is maintained.

It is still further an object of the present invention to provide an improved lead frame and method which does not require an additional handling step.

It is still further an object of the present invention to provide an improved lead frame and method which allows the individual elements to be handled as a unit through test, marking and lead bending operations.

SUMMARY OF THE INVENTION

The foregoing objects are achieved in the present invention wherein an adhesive tape strip such as Mylar is rolled or pressed along the undersurface of the lead frame to contact the lead frame and bonding pad undersurfaces. Upon removal of the tags retaining the individual circuit elements to the lead frame, the parts are maintained in their existing orientation and position by the tape strip in conjunction with the lead frame. The circuit elements may then be handled as a unit by means of the lead frame/tape strip combination in subsequent testing, marking, lead bending or other handling operations.

BRIEF DESCRIPTION OF THE DRAWINGS

The abovementioned and other features and objects of the invention and the manner of attaining them will become more apparent and the invention itself will be best understood by reference to the following description of an embodiment of the invention taken in conjunction with the accompanying drawings, wherein.

DESCRIPTION OF A PREFERRED EMBODIMENT

Figure 1:
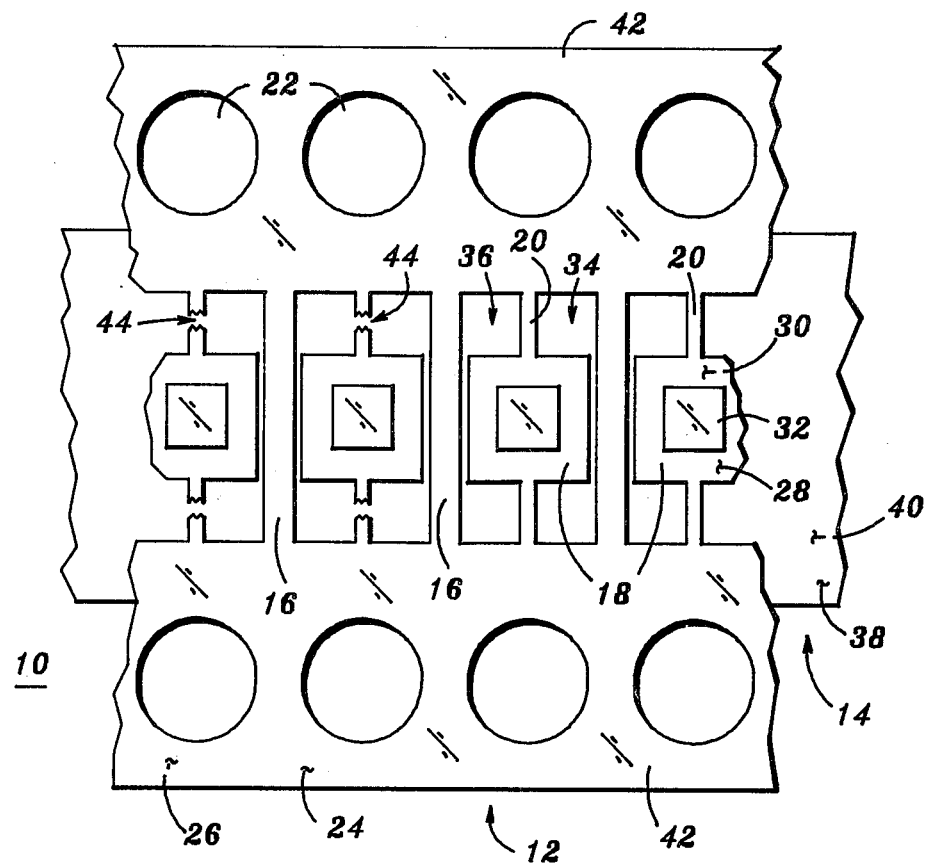
FIG. 1 is a top plan view of a portion of a lead frame according to the present invention showing the lead frame and individual bonding pads in conjunction with an adhesive tape strip both before and after removal of the tags retaining the circuit elements to the lead frame.
Figure 2:
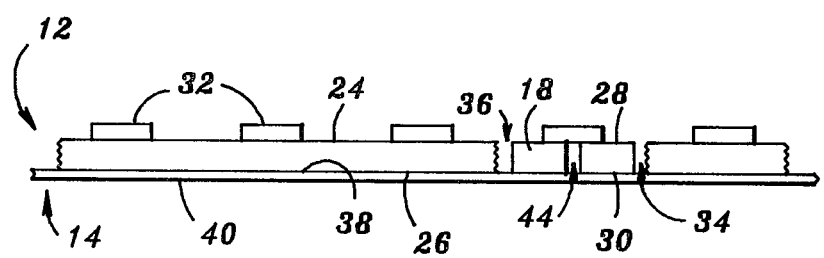
FIG. 2 is a side plan view of the lead frame of FIG. 1 having a portion of one runner cut away to illustrate the adherence of the lead frame and bonding pad to the adhesive tape strip.

Referring now to FIGS. 1 and 2, an improved lead frame 10 according to the present invention is shown. Improved lead frame 10 comprises in major part a conventional lead frame 12 in conjunction with an adhesive tape strip 14.

In the embodiment illustrated, lead frame 12 comprises a pair of parallel and spaced apart runners 42 interconnected by means of tie bars 16, and bonding pads 18 as removably affixed to tags 20. A plurality of perforations 22 communicate between upper face 24 and lower face 26 of lead frame 12. Perforations 22, allow for the indexing and accurate positioning of lead frame 12 through die bonding and other handling operations. Tie bars 16 maintain the structural integrity of lead frame 12 both before and after removal of tags 20 attached to bonding pads 18.

As shown, bonding pads 18 present an upper surface 28 and opposite lower surface 30. In general, a die 32 is bonded to upper surface 28 of one of bonding pads 18 during a die bonding operation. Together, die 32 and one of bonding pads 18 comprise an individual circuit element. Although not illustrated, bonding pads 18 may additionally comprise a number of leads to the individual circuit elements in the die for use in a subsequent wire bonding operation.

Bonding pads 18 are removable from lead frame 12 by the severance of tags 20 at detachment points 44. Thus, interstitial spaces 34 and 36 separating bonding pad 18 from lead frame 12 become conterminous upon the severance of tags 20. In a conventional operation, an individual die 32 as bonded to one of bonding pads 18 is then physically and individually removed from lead frame 12.

In the present invention, an adhesive tape strip 14 having an adhesive surface 38 and an opposite surface 40 is rolled or pressed onto lead frame 12 such that adhesive surface 38 contacts lower face 26 and lower surface 30. In general, adhesive tape strip 14 could be applied after the die bonding step. In this manner, adhesive tape strip 14 is adhesively secured to lead frame 12 and bonding pads 18 both before and after severance of tags 20 at detachment points 44. Thus, the position and orientation of the individual components comprising die 32 and its associated one of bonding pads 18 is maintained. It should be noted that tie bars 16 provide structural integrity to lead frame 12 such that the combination of lead frame 12, adhesive tape strip 14 and severed bonding pads 18 may be handled as a unit through subsequent test, lead bending, marking or other handling operations.

In the embodiment above described, adhesive tape strip 14 may be conveniently furnished as standard eight millimeter polyethylene terephthalate tape such as Mylar (trademark of E. I. du Pont de Nemours & Co., Wilmington, DE). However, any other adhesive tape comprising a nonconductive material may be utilized as well, as the small amount of adhesive remaining on lower surface 30 of bonding pads 18 after removal from adhesive tape strip 14 will not affect subsequent circuit element attachment.

What has been provided therefore is an improved lead frame and method which is inexpensive to implement and uses readily available materials. Further, the improved lead frame and method of the present invention maintains the orientation and position of the individual elements while not requiring any additional handling step. Moreover, the improved lead frame and method of the present invention allows the individual elements to be handled as a unit through test, marking, lead bending and other handling operations.

While there have been described above the principles of this invention in conjunction with specific apparatus, it is to be clearly understood that this description is made only by way of example and not as a limitation to the scope of the invention. Particularly, other lead frame structures may be utilized in conjunction with an adhesive strip according to the present invention which utilize only a single runner, and/or different bonding pad, tie bar or tag element configurations.

We claim:
1. A lead frame comprising:
at least one runner presenting parallel opposite upper and lower faces thereof;
a plurality of bonding pads detachably affixed to said runner, said bonding pads presenting opposite upper and lower surfaces thereof; and
a tape strip adhesively and removably secured to said runner lower face and bonding pad lower surfaces.

2. The lead frame of claim 1 wherein said lead frame further comprises a die bonded to said bonding pad upper surfaces.

3. The lead frame of claim 1 wherein said tape strip comprises a polyethylene terephthalate tape.

4. A method for handling a plurality of components comprising the steps of:
providing a lead frame having at least one runner presenting parallel opposite upper and lower faces thereof;
detachably furnishing a plurality of bonding pads pre-affixed to said runner, said bonding pads presenting opposite upper and lower surfaces thereof; and
adhesively and removably securing a tape strip to said runner lower face and said bonding pad lower surfaces.

5. The method of claim 4 wherein said step of adhesively and removably securing is carried out by means of an adhesive tape.

6. The method of claim 5 wherein said step of adhesively and removably securing is carried out by means of polyethylene terephthalate tape.

7. A lead frame comprising:
first and second parallel and spaced-apart runners having a plurality of generally perpendicularly disposed tie bars therebetween, said tie bars being in a generally parallel and spaced apart relationship and said runners presenting parallel opposite upper and lower faces thereof;
a plurality of bonding pads detachably affixed to said runners and disposed interstitially between said tie bars, said bonding pads presenting opposite upper and lower surfaces thereof; and
a tape strip extending longitudinally between said runners and adhesively and removably secured to said runner lower faces and said bonding pad lower surfaces;
whereby said bonding pads may remain adhesively and removably secured to said tape strip after detachment from said runners.

8. The lead frame of claim 7 wherein said lead frame comprises a die bonded to said bonding pad.

9. The lead frame of claim 7 wherein said tape strip comprises an adhesive tape.

10. The lead frame of claim 9 wherein said adhesive tape comprises a polyethylene terephthalate tape.

11. A method for handling a plurality of components comprising the steps of:
providing a lead frame having first and second parallel and spaced-apart runners with a plurality of generally perpendicularly disposed tie bars therebetween in a generally parallel and spaced apart relationship, said lead frame presenting parallel opposite upper and lower faces thereof;
interstitially disposing bonding pads between said tie bars, said bonding pads being detachably affixed to said lead frame and presenting opposite upper and lower surfaces thereof; and
longitudinally extending a tape strip along said lead frame, said tape strip being adhesively and removably secured to said lead frame lower face and said bonding pad lower surface;
whereby said bonding pads may remain adhesively and removably secured to said tape strip after detachment from said lead frame.

12. The method of claim 11 wherein said step of longitudinally extending is carried out by means of an adhesive tape.

13. The method of claim 12 wherein said step of longitudinally extending is carried out by means of polyethylene terephthalate tape.

* * * * *